(12) United States Patent
Yoshikawa et al.

(10) Patent No.: US 11,031,539 B2
(45) Date of Patent: Jun. 8, 2021

(54) PIEZOELECTRIC VIBRATOR AND SENSOR

(71) Applicants: PIEZO STUDIO INC., Sendai (JP); TOHOKU UNIVERSITY, Sendai (JP)

(72) Inventors: Akira Yoshikawa, Sendai (JP); Yuji Ohashi, Sendai (JP); Yuui Yokota, Sendai (JP); Kei Kamada, Sendai (JP); Masatoshi Ito, Sendai (JP); Kenji Inoue, Sendai (JP); Hiroyuki Amano, Sendai (JP)

(73) Assignees: PIEZO STUDIO INC., Miyagi (JP); TOHOKU UNIVERSITY, Miyagi (JP)

( * ) Notice: Subject to any disclaimer, the term of this patent is extended or adjusted under 35 U.S.C. 154(b) by 648 days.

(21) Appl. No.: 15/773,157

(22) PCT Filed: Nov. 4, 2016

(86) PCT No.: PCT/JP2016/082792
§ 371 (c)(1),
(2) Date: May 2, 2018

(87) PCT Pub. No.: WO2017/078135
PCT Pub. Date: May 11, 2017

(65) Prior Publication Data
US 2018/0323366 A1 Nov. 8, 2018

(30) Foreign Application Priority Data
Nov. 5, 2015 (JP) .............................. JP2015-217394

(51) Int. Cl.
*H01L 41/187* (2006.01)
*H01L 41/113* (2006.01)
*H01L 41/053* (2006.01)
*H03H 3/04* (2006.01)
(Continued)

(52) U.S. Cl.
CPC ...... *H01L 41/1132* (2013.01); *H01L 41/0472* (2013.01); *H01L 41/053* (2013.01);
(Continued)

(58) Field of Classification Search
CPC .............................. H01L 41/187; H01L 41/18
(Continued)

(56) References Cited

U.S. PATENT DOCUMENTS 6,455,986 B2 * 9/2002 Chai ................. H03H 9/02039
310/313 A
2002/0027397 A1 * 3/2002 Chai .................... H03H 9/0259
310/313 R
(Continued)

FOREIGN PATENT DOCUMENTS

CN 1359194 A 7/2002
CN 1439194 A 8/2003
(Continued)

OTHER PUBLICATIONS

Yokota et.al., "Growth and Physical Properties of Al doped Ca3NbGa3Si2O14 piezoelecric single crystals", 2014 Joint IEEE International Symposium on the Applications of Ferroelectric, International Workshop on Acoustic Transduction Materials and Devices & Workshop on Piezoresponse Force Microscopy, 10.1109/ISAF 2014.6923019, IEEE, May 12, 2014.
(Continued)

*Primary Examiner* — Derek J Rosenau
(74) *Attorney, Agent, or Firm* — Womble Bond Dickinson (US) LLP

(57) ABSTRACT

To provide a vibrator made of a piezoelectric crystal having a larger electromechanical coupling coefficient and a more satisfactory frequency-temperature characteristic than those of quartz, a vibrating piece (101) is made of a $Ca_3Ta(Ga_{1-x}Al_x)_3Si_2O_{14}$ single crystal ($0<x\leq1$). In the single crystal, letting θ be a rotation angle from an X-Z plane about an X-axis serving as a rotation axis, $18x+17.5\leq\theta\leq24x+24.5$ is set. In addition, the vibrating piece (101) is made of a $Ca_3Nb(Ga_{1-x}Al_x)_3Si_2O_{14}$ single crystal ($0<x\leq1$). In the single crystal of this arrangement, letting θ be a rotation angle from an X-Z plane about an X-axis serving as a rotation axis, $25x+23.083\leq\theta\leq32x+26.167$ is set.

18 Claims, 4 Drawing Sheets

(51) Int. Cl.
*H03H 9/02* (2006.01)
*H01L 41/047* (2006.01)
*H01L 41/09* (2006.01)

(52) U.S. Cl.
CPC ............ *H01L 41/09* (2013.01); *H01L 41/113* (2013.01); *H01L 41/187* (2013.01); *H03H 3/04* (2013.01); *H03H 9/02039* (2013.01); *H03H 2003/0407* (2013.01)

(58) Field of Classification Search
USPC ...................................... 310/358; 252/62.9 R
See application file for complete search history.

(56) References Cited

U.S. PATENT DOCUMENTS

| | | | |
|---|---|---|---|
| 2003/0146481 | A1 | 8/2003 | Inoue et al. |
| 2003/0164657 | A1* | 9/2003 | Inoue ................ H03H 9/02543 310/313 A |
| 2008/0100176 | A1 | 5/2008 | Haskell et al. |
| 2013/0240776 | A1 | 9/2013 | Onodera et al. |

FOREIGN PATENT DOCUMENTS

| | | |
|---|---|---|
| CN | 103180492 A | 6/2013 |
| CN | 104695017 A | 6/2015 |
| JP | 2002-118442 A | 4/2002 |
| JP | 2002-271171 A | 9/2002 |
| JP | 2004-534222 A | 11/2004 |
| JP | 2008-019122 A | 1/2008 |
| JP | 2014-093627 A | 5/2014 |
| WO | WO 2012/049846 A1 | 4/2012 |

OTHER PUBLICATIONS

Kudo et al., "Growth of Al doped Ca3TaGa3Si2O14 piezoelectric single crystals with various Al concentrations", Journal of Crystal Growth, vol. 401, 2014, pp. 173-176.

Puccio et al., "SAW Parameters on Y-cut Langasite Structured Materials", IEEE Transactions on Ultrasonics, Ferroelectrics and Frequency Control, vol. 54, No. 9, Sep. 2007, pp. 1873-1881.

Supplementary Partial European Search Report and Written Opinion received for EP Patent Application No. 16862194.4, dated Jun. 4, 2019, 14 pages.

Yu et al., "Investigation of Ca3TaGa3Si2O14 piezoelectric crystals for high temperature sensors", Journal of Applied Physics, vol. 109, No. 11, Jun. 2011, pp. 114103-1-114103-6.

International Search Report and Written Opinion received for PCT Patent Application No. PCT/JP2016/082792, dated Dec. 13, 2016, 14 pages (7 pages of English Translation and 7 pages of Original Document).

International Preliminary Report on Patentability received for PCT Patent Application No. PCT/JP2016/082792, dated May 17, 2018, 12 pages (7 pages of English Translation and 5 pages of Original Document).

Supplementary European Search Report and Written Opinion received for EP Patent Application No. 16862194.4, dated Sep. 10, 2019, 12 pages.

European Search Report and Search Opinion received for EP Patent Application No. 20166992.6, dated Jul. 16, 2020, 10 pages.

European Search Report and Search Opinion received for EP Patent Application No. 20166995.9, dated Jul. 16, 2020, 13 pages.

Jen et al., "Experimental investigation of the BAW device potentials of singly rotated Y-cut ordered Langasite-structure crystals", Proceedings of the 2002 IEEE International Frequency Control Symposium & PDA Exhibition, May 29, 2002, pp. 307-310.

Ohashi et al., "Measurements of acoustical physical constants for Ca3Nb(Ga0.75Al0.25)3Si2O14 single crystal using the ultrasonic microspectroscopy system", 2015 IEEE International Ultrasonics Symposium Proceedings, Oct. 21, 2015, 3 pages.

* cited by examiner

CUT ANGLE DEPENDENCE OF
FREQUENCY TEMPERATURE CHARACTERISTIC

CUT ANGLE DEPENDENCE OF
ELECTROMECHANICAL COUPLING COEFFICIENT

CUT ANGLE DEPENDENCE OF
FREQUENCY TEMPERATURE CHARACTERISTIC

Al SUBSTITUTION AMOUNT
DEPENDENCE OF
OPTIMUM CUT ANGLE

CHANGE IN RESONANCE
CHARACTERISTIC BY SOLUTION

CHANGE IN RESONANCE
CHARACTERISTIC BY SOLUTION

PIEZOELECTRIC VIBRATOR AND SENSOR

TECHNICAL FIELD

The present invention relates to a piezoelectric vibrator using a vibrating piece made of a $Ca_3$ $(Ta_{1-y}Nb_y)(Ga_{1-x}Al_x)_3Si_2O_{14}$ single crystal ($0<x\le1$, $0\le y\le1$) and a sensor using the piezoelectric vibrator.

BACKGROUND ART

Recently, with the proliferation of smartphones and high-speed data communications, traffic of wide area communication networks has increased, and new technologies for the broadband communication system have been actively developed. In the broadband communication methods, a piezoelectric device (for example, a piezoelectric vibrator, an oscillator, a voltage controlled crystal oscillator (VCXO), a monolithic crystal filter (MCF), or the like) compatible with frequencies in a broadband is one of the key devices. For example, in the VCXO, quartz is generally used because of its availability and satisfactory frequency-temperature characteristic (see patent literature 1).

RELATED ART LITERATURE

Patent Literature

Patent Literature 1: Japanese Patent Laid-Open No. 2004-534222

DISCLOSURE OF INVENTION

Problem to be Solved by the Invention

However, in the VCXO using a quartz, the electromechanical coupling coefficient of the quartz oscillator is 0.7% that is a very low value, and the frequency variable width is narrower, and thus it is becoming more difficult to keep up with the above-described broadband implementation. For this reason, a vibrator made of a piezoelectric crystal having an excellent frequency temperature characteristic which allows the widening of the band of the frequency variable width is required. An $LiTaO_3$ piezoelectric single crystal has a large electromechanical coupling coefficient and is capable of realizing a broadband frequency variable width. However, the frequency-temperature characteristic is as large as 1,000 ppm (−30° C. to 80° C.).

The present invention has been made to solve the above-described problem, and has as its object to provide a vibrator made of a piezoelectric crystal having a larger electromechanical coupling coefficient and a more satisfactory frequency-temperature characteristic than those of quartz.

Means of Solution to the Problem

According to the present invention, there is provided a piezoelectric vibrator including at least one vibrating piece made of a $Ca_3Ta(Ga_{1-x}Al_x)_3Si_2O_{14}$ single crystal ($0<x\le1$), wherein in the single crystal, letting θ be a rotation angle from an X-Z plane about an X-axis serving as a rotation axis, $18x+17.5\le\theta\le24x+24.5$ is set.

In the piezoelectric vibrator, more preferably, $20x+20.16\le\theta\le21x+22.083$ is set.

According to the present invention, there is also provided a piezoelectric vibrator including at least one vibrating piece made of a $Ca_3Nb(Ga_{1-x}Al_x)_3Si_2O_{14}$ single crystal ($0<x\le1$), wherein in the single crystal, letting θ be a rotation angle from an X-Z plane about an X-axis serving as a rotation axis, $25x+23.083\le\theta\le32x+26.167$ is set.

In the piezoelectric vibrator, more preferably, $27.6x+24.367\le\theta\le27.8x+25.783$ is set.

According to the present invention, there is also provided a piezoelectric vibrator including at least one vibrating piece made of a $Ca_3(Ta_{1-y}Nb_y)(Ga_{1-x}Al_x)_3Si_2O_{14}$ single crystal ($0<x\le1$, $0\le y\le1$), wherein in the single crystal, letting θ be a rotation angle from an X-Z plane about an X-axis serving as a rotation axis, $\{18+(25-18)y\}x+17.5+(23.083-17.5)y\le\theta\le\{24+(32-24)y\}x+24.5+(26.167-24.5)y$ is set.

In the piezoelectric vibrator, more preferably, $\{20+(27.6-20)y\}x+20.16+(24.367-20.16)y\le\theta\le\{21+(27.8-21)y\}x+22.083+(25.783-22.083)y$ is set.

The piezoelectric vibrator further comprises an electrode provided on the vibrating piece, a connection terminal connected to the electrode, and a hermetic container storing the vibrating piece and filled with an inert gas.

According to the present invention, there is provided a sensor using the above-described piezoelectric vibrator, comprising a measurement region provided on a vibrating piece and brought into contact with a measurement target substance, and measurement means for detecting a mass of the substance that is in contact with the measurement region based on a change in a resonance frequency of the vibrator caused by the contact of the substance with respect to the measurement region.

Effect of the Invention

As described above, according to the present invention, it is possible to obtain excellent effects of providing a vibrator made of a piezoelectric crystal having a larger electromechanical coupling coefficient and a more satisfactory frequency-temperature characteristic than those of quartz and forming a specific excellent sensor using the vibrator.

BEST MODE FOR CARRYING OUT THE INVENTION

The embodiments of the present invention will now be described with reference to the accompanying drawings.

First Embodiment

Figure 1:
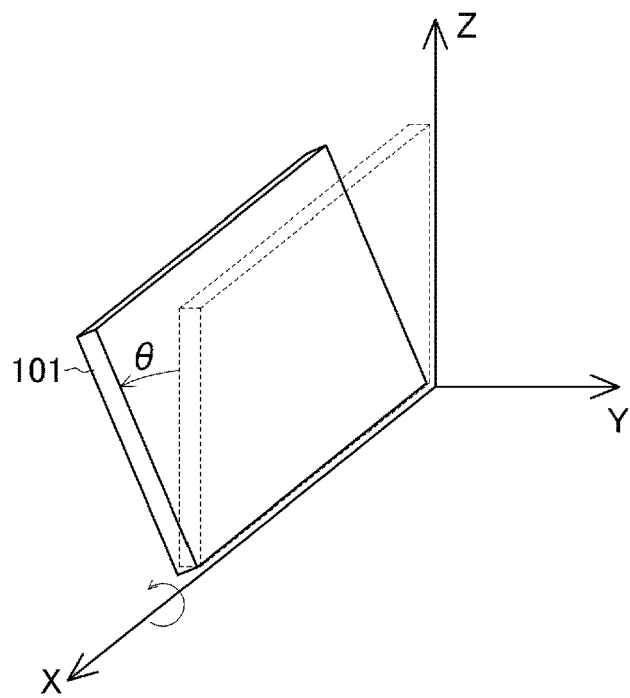
FIG. 1 is a perspective view showing the arrangement of a piezoelectric vibrator according to an embodiment of the present invention.

The first embodiment of the present invention will be described first. FIG. 1 is a perspective view showing the arrangement of a piezoelectric vibrator according to the first embodiment of the present invention. This piezoelectric vibrator includes a vibrating piece 101 made of a $Ca_3Ta(Ga_{1-x}Al_x)_3Si_2O_{14}$ single crystal (0<x≤1). The vibrating piece 101 has, for example, a plate shape. Additionally, in the single crystal, letting θ (degrees) be the rotation angle (cut angle) from the X-Z plane about the X-axis serving as the rotation axis, 18x+17.5≤θ≤24x+24.5 is set. The angle θ complies with the definition of the IEC (International Electrotechnical Commission). In this definition, for example, the angle θ of quartz AT cut is 35°15'. Note that the X-Y plane is the (001) plane of the $Ca_3Ta(Ga_{1-x}Al_x)_3Si_2O_{14}$ single crystal (0<x≤1), the Y-Z plane is the (110) plane of the $Ca_3Ta(Ga_{1-x}Al_x)_3Si_2O_{14}$ single crystal (0<x≤1), and the X-Z plane is the (100) plane of the $Ca_3Ta(Ga_{1-x}Al_x)_3Si_2O_{14}$ single crystal (0<x≤1).

The vibrating piece 101 is obtained by, for example, cutting the piece from an ingot of a $Ca_3Ta(Ga_{1-x}Al_x)_3Si_2O_{14}$ single crystal (0<x≤1) obtained by the Czochralski method using a wire saw and polishing both surfaces.

Figure 2:
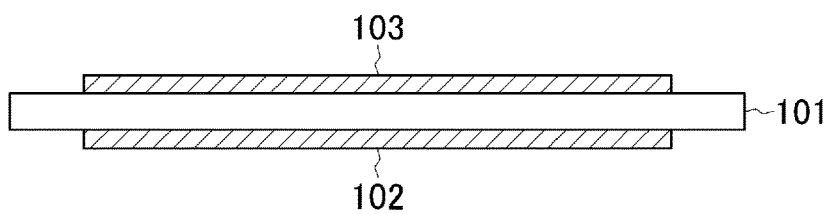
FIG. 2 is a sectional view showing the arrangement of the piezoelectric vibrator according to the embodiment of the present invention.

For example, as shown in FIG. 2, when electrodes are formed, and a predetermined signal is applied, the piezoelectric vibrator can then be operated (oscillated). An electrode 102 is formed on the principal surface of the plate-shaped vibrating piece 101, and an electrode 103 is formed on the lower surface of the vibrating piece 101. The electrodes 102 and 103 can be formed by depositing a predetermined metal material on the principal and lower surfaces of the vibrating piece 101 to form metal films and patterning the formed metal films using a known photolithography technology. Each metal film has a multilayered structure of, for example, a gold layer and a chromium layer. In addition, a circuit configured to apply a signal (excitation signal) being used is connected to a connection terminal (not shown) connected to each of the electrodes 102 and 103.

Additionally, the vibrating piece with the electrodes provided in the above-described way being used is stored in a hermetic container filled with an inert gas such as nitrogen or argon. For example, to form a chip having the 3225 size or less in JIS or, in particular, a chip having the 2520 size or less, the conventional quartz oscillator needs vacuum sealing because of the series resistance value. However, according to the vibrator of the present invention, the similar performance can be achieved even if used in an inert gas atmosphere.

Figure 3A:
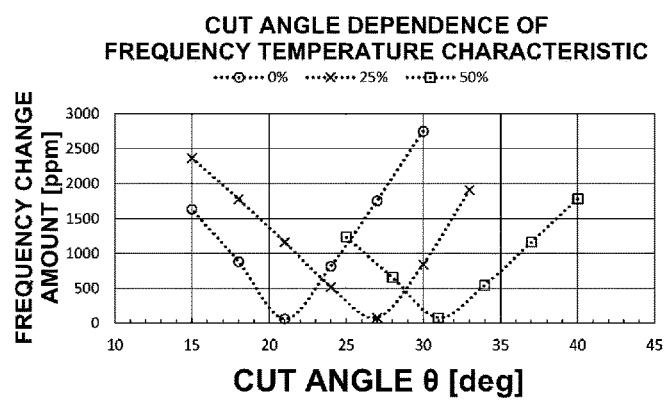
FIG. 3A is a graph showing the cut angle θ dependence of the frequency-temperature characteristic of a piezoelectric vibrator according to the first embodiment.
Figure 3B:
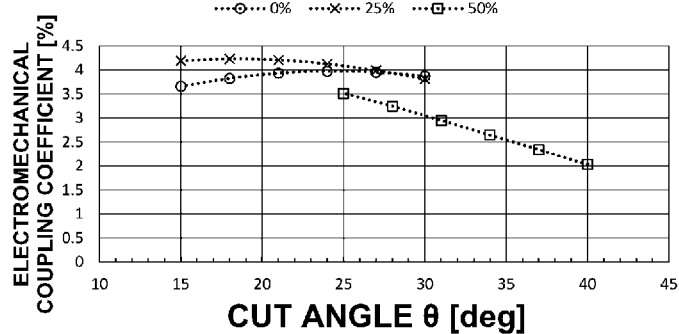
FIG. 3B is a graph showing the cut angle θ dependence of the electromechanical coupling coefficient of the piezoelectric vibrator according to the first embodiment.

A result obtained by measuring the cut angle θ dependence of the frequency-temperature characteristic and the cut angle θ dependence of the electromechanical coupling coefficient of the $Ca_3Ta(Ga_{1-x}Al_x)_3Si_2O_{14}$ single crystal according to the first embodiment when an Al substitution amount (composition ratio)×(the ratio to substitute Ga with Al) is set to 0%, 25%, and 50% will be described next. FIG. 3A is a graph showing the cut angle θ dependence of the frequency-temperature characteristic. FIG. 3B is a graph showing the cut angle θ dependence of the electromechanical coupling coefficient. A crystal of each Al substitution amount was cut at a cut angle θ of 3° step, and a vibrator was produced using an obtained vibrating piece. The vibrating piece thickness was adjusted such that the resonance frequency became 24 MHz.

In the cut angle θ dependence of the frequency temperature-characteristic shown in FIG. 3A, the temperature characteristic of the resonance frequency was measured within the range of −30° C. to 80° C., and the frequency change amount was normalized by the resonance frequency at 25° C. and displayed in ppm. In the cut angle θ dependence of the electromechanical coupling coefficient shown in FIG. 3B, calculation was performed using the resonance frequency and the antiresonance frequency, and the result was displayed in percentage.

As shown in FIG. 3A, when the cut angle is changed, the frequency-temperature characteristic exhibits a change such that the frequency change amount has the minimum value at a certain cut angle. In addition, it is observed that when the Al substitution amount is changed, the cut angle that decreases the amount of frequency change also changes.

On the other hand, as shown in FIG. 3B, when the cut angle is changed, the electromechanical coupling coefficient exhibits a change that generally projects upward, and a cut angle at which the electromechanical coupling coefficient becomes maximum exists. In addition, as similar to the frequency change, when the Al substitution amount is changed, the cut angle that provides the maximum electromechanical coupling coefficient changes as well. The electromechanical coupling coefficient of an AT cut quartz oscillator that is generally used is 0.7%. However, electromechanical coupling coefficient of the piezoelectric vibrator according to the present invention is 2% or more, and this indeed contributes to widening of the band of the frequency variable width.

Figure 4:
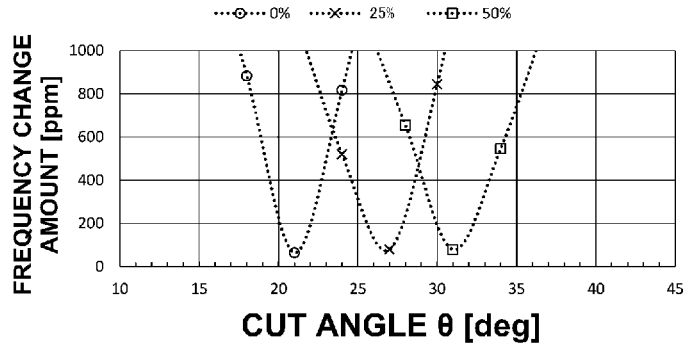
FIG. 4 is a graph showing a result obtained by expanding a region where the amount of frequency temperature change shown in FIG. 3A is 1,000 ppm or less.
Figure 5:
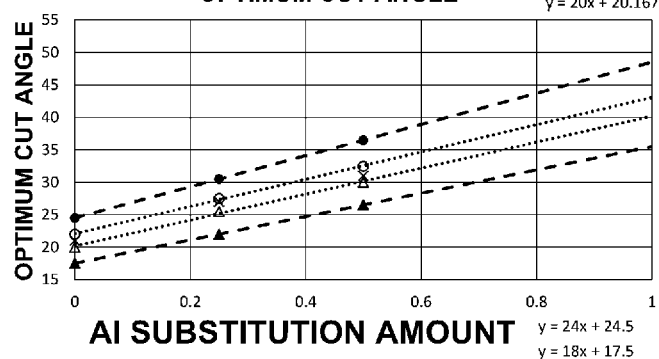
FIG. 5 is a graph showing the relationship between the optimum cut angle and the Al substitution amount of the piezoelectric vibrator according to the first embodiment.

FIG. 4 shows a result obtained by expanding a region where the amount of frequency temperature change shown in FIG. 3A is 1,000 ppm or less. FIG. 5 shows a state in which the Al substitution amount is plotted along the abscissa, and the cut angle at which the frequency temperature change becomes minimum and the cut angle at which the frequency temperature change is 1,000 ppm or less or 200 ppm or less are plotted along the ordinate using the result shown in FIG. 4. When linear approximation is performed for each plot, the following result can be obtained.

When the range of the cut angle θ is set to "18x+17.5≤θ≤24x+24.5" in accordance with the Al substitution amount (composition ratio) x, the amount of frequency temperature change can preferably be set to 1,000 ppm or less. This is the range indicated by two thick broken lines shown in FIG. 5. In addition, when the range is set to "20x+20.16≤θ≤21x+22.083" that is the range indicated by two thin dotted lines shown in FIG. 5, the amount of frequency temperature change can more preferably be set to 200 ppm or less.

An oscillation activation time will be described next. The oscillation activation time of the piezoelectric vibrator according to the first embodiment using the vibrating piece 101 in which the Al substitution amount (composition ratio) x was set to 5%, and the cut angle was set to 21.1° and the oscillation activation time of a piezoelectric vibrator using a vibrating piece made of AT cut quartz were compared. In both the piezoelectric vibrators, the vibrating piece thickness was set such that the resonance frequency became 8 MHz. A predetermined signal voltage was applied to the two electrodes to obtain an oscillation state at the resonance frequency of 8 MHz, and the time from the signal voltage application to stabilization of the oscillation was measured. The results of the measurement is shown in Table 1 below. Note that Table 1 also shows the values of resonant resistance.

TABLE 1

|  | Oscillation activation time (μsec) | Resonant resistance (Ω) |
| --- | --- | --- |
| First embodiment | 130 | to 30 |
| Quartz oscillator | 1,500 | 170 |

The resonant resistance of the quartz oscillator is as high as 170Ω or more. The oscillation activation time is 1,500 μsec, that is, the activation time is very long. On the other hand, in the first embodiment, the resonant resistance is as low as 30Ω or less. The oscillation activation time is 130 μsec, that is, the activation time is 1/10 or less of that in quartz. In a recent electronic device, a sleep mode in which the device is activated only when necessary, and otherwise, performs only a minimum operation is frequently used from the viewpoint of reduction of power consumption.

The return time from the sleep mode, that is, the activation time of the oscillation circuit is a preparation time for the device to perform the original operation. Shortening the activation time is an important factor for reduction of power consumption. In the conventional vibrator, the activation time is relatively long, and power is wasted. According to the present invention, the activation time can be shortened drastically, and this contributes to the reduction of power consumption of a device.

Second Embodiment

The second embodiment of the present invention will be described next. In the second embodiment, the arrangement shown in the perspective view of FIG. 1 is also used, as in the above-described first embodiment. In the second embodiment, a piezoelectric vibrator includes a vibrating piece 101 made of a $Ca_3Nb(Ga_{1-x}Al_x)_3Si_2O_{14}$ single crystal (0<x≤1). The vibrating piece 101 has, for example, a plate shape. Additionally, in the single crystal, letting θ (degrees) be the rotation angle (cut angle) from the X-Z plane about the X-axis serving as the rotation axis, 25x+23.083≤θ≤32x+26.167 is set. The angle θ complies with the definition of the IEC (International Electrotechnical Commission). In this definition, for example, the angle θ of quartz AT cut is 35°15'. Note that the X-Y plane is the (001) plane of the $Ca_3Nb(Ga_{1-x}Al_x)_3Si_2O_{14}$ single crystal (0<x≤1), the Y-Z plane is the (110) plane of the $Ca_3Nb(Ga_{1-x}Al_x)_3Si_2O_{14}$ single crystal (0<x≤1), and the X-Z plane is the (100) plane of the $Ca_3Nb(Ga_{1-x}Al_x)_3Si_2O_{14}$ single crystal (0<x≤1).

The vibrating piece 101 according to the second embodiment is also obtained by, for example, cutting the piece from an ingot of a $Ca_3Nb(Ga_{1-x}Al_x)_3Si_2O_{14}$ single crystal (0<x≤1) obtained by the Czochralski method using a wire saw and polishing both surfaces.

In addition, as shown in FIG. 2, when electrodes are formed, and a predetermined signal is applied, the piezoelectric vibrator can be operated (oscillated). An electrode 102 is formed on the principal surface of the plate-shaped vibrating piece 101, and an electrode 103 is formed on the lower surface of the vibrating piece 101. The electrodes 102 and 103 can be formed by depositing a predetermined metal material on the principal and lower surfaces of the vibrating piece 101 to form metal films and patterning the formed metal films using a known photolithography technology. Each metal film has a multilayered structure of, for example, a gold layer and a chromium layer. In addition, a circuit configured to apply a signal (excitation signal) being used is connected to a connection terminal (not shown) connected to each of the electrodes 102 and 103.

Figure 6A:
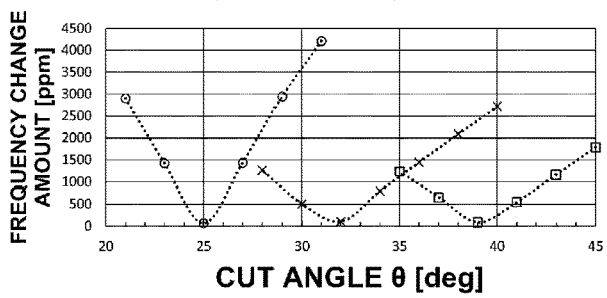
FIG. 6A is a graph showing the cut angle θ dependence of the frequency-temperature characteristic of a piezoelectric vibrator according to the second embodiment.
Figure 6B:
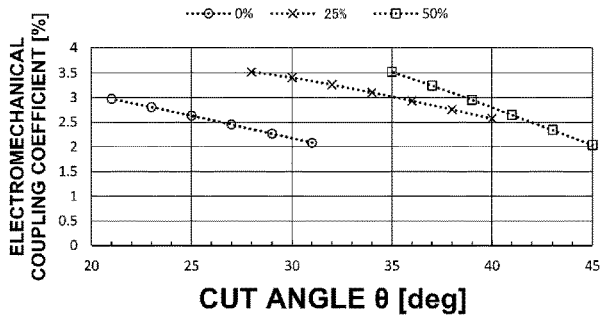
FIG. 6B is a graph showing the cut angle θ dependence of the electromechanical coupling coefficient of the piezoelectric vibrator according to the second embodiment.

A result obtained by measuring the cut angle θ dependence of the frequency-temperature characteristic and the cut angle θ dependence of the electromechanical coupling coefficient of the $Ca_3Nb(Ga_{1-x}Al_x)_3Si_2O_{14}$ single crystal according to the second embodiment when an Al substitution amount x (the ratio to substitute Ga with Al) is set to 0%, 25%, and 50% will be described next. FIG. 6A is a graph showing the cut angle θ dependence of the frequency-temperature characteristic. FIG. 6B is a graph showing the cut angle θ dependence of the electromechanical coupling coefficient. A crystal of each Al substitution amount was cut at a cut angle θ of 3° step, and a vibrator was produced using an obtained vibrating piece. The vibrating piece thickness was adjusted such that the resonance frequency became 24 MHz.

In the cut angle θ dependence of the frequency-temperature characteristic shown in FIG. 6A, the temperature characteristic of the resonance frequency was measured within the range of −30° C. to 80° C., and the frequency change amount was normalized by the resonance frequency at 25° C. and displayed in ppm. In the cut angle θ dependence of the electromechanical coupling coefficient shown in FIG. 6B, calculation was performed using the resonance frequency and the antiresonance frequency, and the result was displayed in percentage.

As shown in FIG. 6A, when the cut angle is changed, the frequency-temperature characteristic exhibits a change such that the frequency change amount has the minimum value at a certain cut angle. In addition, it is observed that when the Al substitution amount is changed, the cut angle that decreases the amount of frequency change also changes.

On the other hand, as shown in FIG. 6B, when the cut angle is changed, the electromechanical coupling coefficient exhibits a change that generally projects upward, and a cut angle at which the electromechanical coupling coefficient becomes maximum exists. In addition, when the Al substitution amount is changed, the cut angle that provides the maximum electromechanical coupling coefficient changes as well. The electromechanical coupling coefficient of an AT cut quartz oscillator that is generally used is 0.7%. However, electromechanical coupling coefficient of the piezoelectric vibrator according to the present invention is 2% or more, and this contributes to widening of the band of the frequency variable width, as can be seen.

Figure 7:
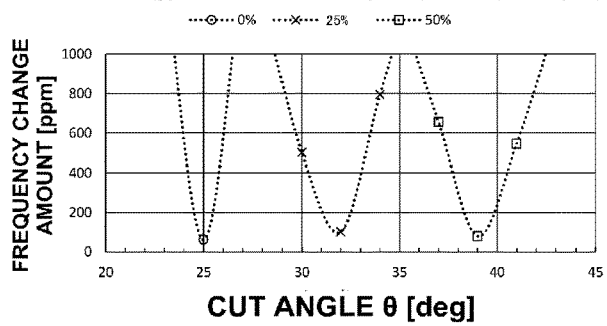
FIG. 7 is a graph showing a result obtained by expanding a region where the amount of frequency temperature change shown in FIG. 6A is 1,000 ppm or less.
Figure 8:
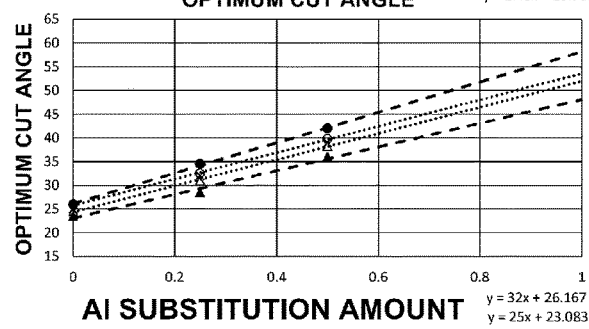
FIG. 8 is a graph showing the relationship between the optimum cut angle and the Al substitution amount of the piezoelectric vibrator according to the second embodiment.

FIG. 7 shows a result obtained by expanding a region where the amount of frequency temperature amount shown in FIG. 6A is 1,000 ppm or less. FIG. 8 shows a state in which the Al substitution amount is plotted along the abscissa, and the cut angle at which the frequency temperature change becomes minimum and the cut angle at which the frequency temperature change is 1,000 ppm or less or 200 ppm or less are plotted along the ordinate using the result shown in FIG. 7. When linear approximation is performed for each plot, the following result can be obtained.

When the range of the cut angle θ is set to "25x+23.083≤θ≤32x+26.167" in accordance with the Al substitution amount (composition ratio) x, the amount of frequency temperature change can preferably be set to 1,000 ppm or less. This is the range indicated by two thick broken lines shown in FIG. 8. In addition, when the range is set to "27.6x+24.367≤θ≤27.8x+25.783" that is the range indicated by two thin dotted lines shown in FIG. 8, the amount of frequency temperature change can more preferably be set to 200 ppm or less.

Third Embodiment

The third embodiment of the present invention will be described next. In the third embodiment, the arrangement shown in the perspective view of FIG. 1 is also used, as in the above-described first and second embodiments. In the third embodiment, a piezoelectric vibrator includes a vibrating piece 101 made of a $Ca_3(Ta_{1-y}Nb_y)(Ga_{1-x}Al_x)_3Si_2O_{14}$ single crystal (0<x≤1, 0≤y≤1). The vibrating piece 101 has, for example, a plate shape. Additionally, in the single crystal, letting θ (degrees) be the rotation angle (cut angle) from the X-Z plane about the X-axis serving as the rotation axis, {18+(25−18)y}x+17.5+(23.083−17.5)y≤θ≤{24+(32−24)y}x+24.5+(26.167−24.5)y is set. The angle θ complies with the definition of the IEC (International Electrotechnical Commission). In this definition, for example, the angle θ of quartz AT cut is 35°15'. Note that the X-Y plane is the (001) plane of the $Ca_3(Ta_{1-y}Nb_y)(Ga_{1-x}Al_x)_3Si_2O_{14}$ single crystal (0<x≤1, 0≤y≤1), the Y-Z plane is the (110) plane of the $Ca_3(Ta_{1-y}Nb_y)(Ga_{1-x}Al_x)_3Si_2O_{14}$ single crystal (0<x≤1, 0≤y≤1), and the X-Z plane is the (100) plane of the $Ca_3(Ta_{1-y}Nb_y)(Ga_{1-x}Al_x)_3Si_2O_{14}$ single crystal (0<x≤1, 0≤y≤1).

The vibrating piece 101 according to the third embodiment is also obtained by, for example, cutting the piece from an ingot of a $Ca_3(Ta_{1-y}Nb_y)(Ga_{1-x}Al_x)_3Si_2O_{14}$ single crystal (0<x≤1, 0≤y≤1) obtained by the Czochralski method using a wire saw and polishing both surfaces.

In addition, as shown in FIG. 2, when electrodes are formed, and a predetermined signal is applied, the piezoelectric vibrator can be operated (oscillated). An electrode 102 is formed on the principal surface of the plate-shaped vibrating piece 101, and an electrode 103 is formed on the lower surface of the vibrating piece 101. The electrodes 102 and 103 can be formed by depositing a predetermined metal material on the principal and lower surfaces of the vibrating piece 101 to form metal films and patterning the formed metal films using a known photolithography technology. Each metal film has a multilayered structure of, for example, a gold layer and a chromium layer. In addition, a circuit configured to apply a signal (excitation signal) being used is connected to a connection terminal (not shown) connected to each of the electrodes 102 and 103.

Next, in the $Ca_3(Ta_{1-y}Nb_y)(Ga_{1-x}Al_x)_3Si_2O_{14}$ single crystal according to the third embodiment, as a result of measurement as in the above-described first and second embodiments, when the range of the cut angle θ is set to "{18+(25−18)y}x+17.5+(23.083−17.5)y≤θ≤{24+(32−24)y}x+24.5+(26.167−24.5)y" in accordance with the Al composition ratio x and the Nb composition ratio y, the amount of frequency temperature change can preferably be set to 1,000 ppm or less. In addition, when the range is set to "{20+(27.6−20)y}x+20.16+(24.367−20.16)y≤θ≤{21+(27.8−21)y}x+22.083+(25.783−22.083)y", the amount of frequency temperature change can more preferably be set to 200 ppm or less.

Fourth Embodiment

A sensor using the piezoelectric vibrator according to the present invention will be described next. This sensor includes a measurement region provided on the vibrating piece and brought into contact with a measurement target substance, and a measurement means for detecting the mass of the substance that is in contact with the measurement region based on a change in the resonance frequency of the vibrator caused by the contact of the substance with respect to the measurement region. The vibrating piece is made of, for example, a $Ca_3Ta(Ga_{1-x}Al_x)_3Si_2O_{14}$ (Al substitution amount 5%) single crystal. The cut angle (rotation angle) θ is set to 21.1°, and the frequency is set to about 10 MHz. The angle θ complies with the definition of the IEC (International Electrotechnical Commission). In this definition, for example, the angle θ of quartz AT cut is 35°15'.

Figure 9:
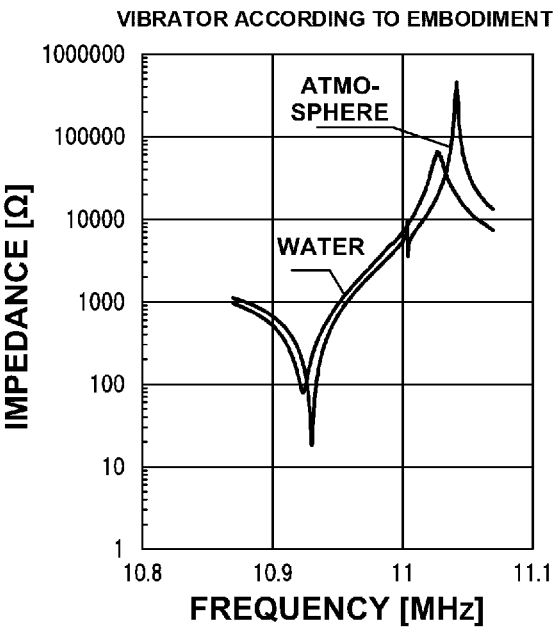
FIG. 9 is a graph showing a result obtained by measuring, using a sensor according to the fourth embodiment, a change in an equivalent series resonant resistance in a piezoelectric vibrator in a state in which pure water is brought into contact with a measurement region.
Figure 10:
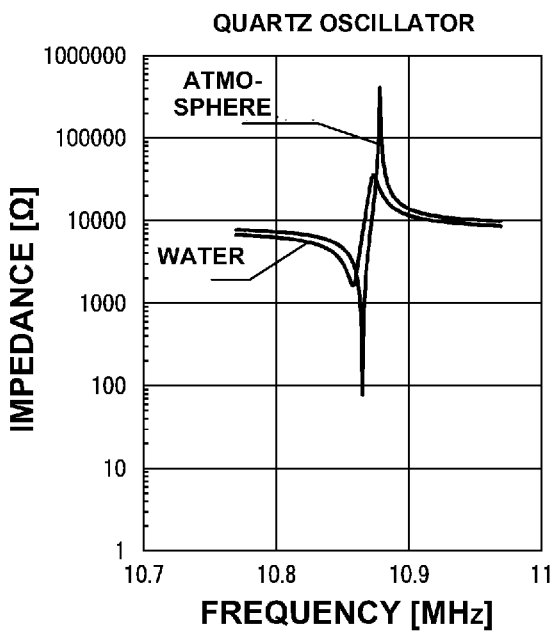
FIG. 10 is a graph showing a result obtained by measuring, using a conventional sensor using a quartz oscillator, a change in an equivalent series resonant resistance in the quartz oscillator in a state in which pure water is brought into contact with a measurement region.

Using this sensor, a change in the equivalent series resonant resistance in the piezoelectric vibrator was measured in a state in which a predetermined solution (pure water) was in contact with the measurement region. FIG. 9 shows the result. In addition, even for a sensor using a similar piezoelectric vibrator (quartz oscillator) whose vibrating piece was made of quartz, a change in the equivalent series resonant resistance was measured in a state in which the predetermined solution was in contact with the measurement region. FIG. 10 shows the result.

In the sensor using the piezoelectric vibrator according to the present invention, the equivalent series resonant resistance in atmosphere was as low as about 20Ω. Even if pure water was added, the equivalent series resonant resistance was 90Ω and degraded little. On the other hand, in the sensor using the quartz oscillator, the equivalent series resonant resistance in atmosphere was about 90Ω. When pure water was added, the equivalent series resonant resistance degraded to 2 kΩ.

As described above, according to the sensor using the piezoelectric vibrator of the present invention, the degradation in the resonance characteristic (the degradation in the equivalent series resonant resistance) in a liquid is small, as compared to the sensor using the conventional quartz oscillator. The piezoelectric vibrator according to the present invention is suitable as a so-called QCM used for a liquid. Note that Ca may partially be substituted with Sr, and the above description also applies to this arrangement.

Note that the present invention is not limited to the embodiments described above, and many modifications and combinations can be made by those who have ordinary knowledge in this field within the technical scope of the present invention, as a matter of course.

EXPLANATION OF THE REFERENCE NUMERALS AND SIGNS

101 . . . vibrating piece, 102, 103 . . . electrode

The invention claimed is:
1. A piezoelectric vibrator comprising at least one vibrating piece made of a $Ca_3Ta(Ga_{1-x}Al_x)_3Si_2O_{14}$ single crystal (0<x≤1), wherein in the single crystal, letting θ be a rotation angle from an X-Z plane about an X-axis serving as a rotation axis, $18x+17.5 \le \theta \le 24x+24.5$ is set.

2. The piezoelectric vibrator according to claim 1, wherein $20x+20.16 \le \theta \le 21x+22.083$ is set.

3. A piezoelectric vibrator comprising at least one vibrating piece made of a $Ca_3Nb(Ga_{1-x}Al_x)_3Si_2O_{14}$ single crystal ($0<x\le 1$),
wherein in the single crystal, letting θ be a rotation angle from an X-Z plane about an X-axis serving as a rotation axis, $25x+23.083 \le \theta \le 32x+26.167$ is set.

4. The piezoelectric vibrator according to claim 3, wherein $27.6x+24.367 \le \theta \le 27.8x+25.783$ is set.

5. A piezoelectric vibrator comprising at least one vibrating piece made of a $Ca_3(Ta_{1-y}Nb_y)(Ga_{1-x}Al_x)_3Si_2O_{14}$ single crystal ($0<x\le 1$, $0\le y\le 1$),
wherein in the single crystal, letting θ be a rotation angle from an X-Z plane about an X-axis serving as a rotation axis, $\{18+(25-18)y\}x+17.5+(23.083-17.5)y \le \theta \le \{24+(32-24)y\}x+24.5+(26.167-24.5)y$ is set.

6. The piezoelectric vibrator according to claim 5, wherein $\{20+(27.6-20)y\}x+20.16+(24.367-20.16)y \le \theta \le \{21+(27.8-21)y\}x+22.083+(25.783-22.083)y$ is set.

7. The piezoelectric vibrator according to claim 1, further comprising:
an electrode provided on the vibrating piece;
a connection terminal connected to the electrode; and
a hermetic container storing the vibrating piece and filled with an inert gas.

8. A sensor using a piezoelectric vibrator described in claim 1, comprising:
a measurement region provided on a vibrating piece and brought into contact with a measurement target substance; and
measurement means for detecting a mass of the substance that is in contact with the measurement region based on a change in a resonance frequency of the vibrator caused by the contact of the substance with respect to the measurement region.

9. The piezoelectric vibrator according to claim 2, further comprising:
an electrode provided on the vibrating piece;
a connection terminal connected to the electrode; and
a hermetic container storing the vibrating piece and filled with an inert gas.

10. The piezoelectric vibrator according to claim 3, further comprising:
an electrode provided on the vibrating piece;
a connection terminal connected to the electrode; and
a hermetic container storing the vibrating piece and filled with an inert gas.

11. The piezoelectric vibrator according to claim 4, further comprising:
an electrode provided on the vibrating piece;
a connection terminal connected to the electrode; and
a hermetic container storing the vibrating piece and filled with an inert gas.

12. The piezoelectric vibrator according to claim 5, further comprising:
an electrode provided on the vibrating piece;
a connection terminal connected to the electrode; and
a hermetic container storing the vibrating piece and filled with an inert gas.

13. The piezoelectric vibrator according to claim 6, further comprising:
an electrode provided on the vibrating piece;
a connection terminal connected to the electrode; and
a hermetic container storing the vibrating piece and filled with an inert gas.

14. A sensor using a piezoelectric vibrator described in claim 2, comprising:
a measurement region provided on a vibrating piece and brought into contact with a measurement target substance; and
measurement means for detecting a mass of the substance that is in contact with the measurement region based on a change in a resonance frequency of the vibrator caused by the contact of the substance with respect to the measurement region.

15. A sensor using a piezoelectric vibrator described in claim 3, comprising:
a measurement region provided on a vibrating piece and brought into contact with a measurement target substance; and
measurement means for detecting a mass of the substance that is in contact with the measurement region based on a change in a resonance frequency of the vibrator caused by the contact of the substance with respect to the measurement region.

16. A sensor using a piezoelectric vibrator described in claim 4, comprising:
a measurement region provided on a vibrating piece and brought into contact with a measurement target substance; and
measurement means for detecting a mass of the substance that is in contact with the measurement region based on a change in a resonance frequency of the vibrator caused by the contact of the substance with respect to the measurement region.

17. A sensor using a piezoelectric vibrator described in claim 5, comprising:
a measurement region provided on a vibrating piece and brought into contact with a measurement target substance; and
measurement means for detecting a mass of the substance that is in contact with the measurement region based on a change in a resonance frequency of the vibrator caused by the contact of the substance with respect to the measurement region.

18. A sensor using a piezoelectric vibrator described in claim 6, comprising:
a measurement region provided on a vibrating piece and brought into contact with a measurement target substance; and
measurement means for detecting a mass of the substance that is in contact with the measurement region based on a change in a resonance frequency of the vibrator caused by the contact of the substance with respect to the measurement region.

* * * * *